(12) United States Patent
Alexander et al.

(10) Patent No.: US 7,644,347 B2
(45) Date of Patent: Jan. 5, 2010

(54) SILENT DATA CORRUPTION MITIGATION USING ERROR CORRECTION CODE WITH EMBEDDED SIGNALING FAULT DETECTION

(75) Inventors: James W. Alexander, Aloha, OR (US); Suresh Chittor, Portland, OR (US); Dennis W. Brzezinski, Sunnyvale, CA (US); Kai Cheng, Portland, OR (US); Henk Neefs, Palo Alto, CA (US); Rajat Agarwal, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 516 days.

(21) Appl. No.: 11/240,111

(22) Filed: Sep. 30, 2005

(65) Prior Publication Data

US 2007/0089035 A1 Apr. 19, 2007

(51) Int. Cl.
*G11C 29/00* (2006.01)
(52) U.S. Cl. ........................ 714/799; 714/758
(58) Field of Classification Search .................. 714/799
See application file for complete search history.

(56) References Cited

U.S. PATENT DOCUMENTS

| | | | | |
|---|---|---|---|---|
| 4,661,955 A | * | 4/1987 | Arlington et al. | 714/6 |
| 5,771,247 A | * | 6/1998 | Allen et al. | 714/763 |
| 6,038,679 A | * | 3/2000 | Hanson | 714/5 |
| 6,457,067 B1 | * | 9/2002 | Byers et al. | 710/3 |
| 6,751,192 B1 | * | 6/2004 | Nakata | 370/222 |
| 6,785,835 B2 | * | 8/2004 | MacLaren et al. | 714/6 |
| 7,313,749 B2 | * | 12/2007 | Nerl et al. | 714/764 |
| 2004/0250181 A1 | | 12/2004 | Vogt et al. | |
| 2006/0136800 A1 | * | 6/2006 | Kawabata et al. | 714/763 |
| 2006/0174182 A1 | | 8/2006 | Neefs et al. | |
| 2006/0212775 A1 | * | 9/2006 | Cypher | 714/758 |
| 2006/0212781 A1 | * | 9/2006 | Hewitt et al. | 714/780 |

OTHER PUBLICATIONS

Mukherjee et al, The Soft Error Problem: An Architectural Perspective, Proceedings of the 11th Int'l Symposium on High-Performance Computer Architecture (HCPA Nov. 2005), 5 pages, Massachusettes, USA.

Darnell, et al Configuring DDR2 Memory on Dell Platforms Based on the Intel E7520 and E7525 Chip Sets, Dell's Technology White Papers, Apr. 2005, Dell, pp. 1-10.

Parulkar, et al, Trends and Trade-offs in Designing Highly Robust Throughput Computing Oriented Chips and Systems.

(Continued)

*Primary Examiner*—M. Mujtaba K Chaudry
*Assistant Examiner*—Enam Ahmed
(74) *Attorney, Agent, or Firm*—Blakely, Sokoloff, Taylor & Zafman LLP

(57) ABSTRACT

Embodiments of the invention are generally directed to systems, methods, and apparatuses for mitigating silent data corruption using an error correction code having embedded signaling fault detection. In an embodiment, a memory controller includes an extended error correction code (ECC) and link signaling fault detection logic. The extended ECC includes embedded signaling fault detection. In one embodiment, the extended ECC augments the signaling fault detection capabilities of the signaling fault detection logic.

19 Claims, 7 Drawing Sheets

OTHER PUBLICATIONS

Locklear, Chipkill correct Memory Architecture, Technology Brief, Aug. 2000, pp. 1-4, Dell.com.

Haas, et al, Fully-Buffered DIMM Technology Moves Enterprise Platforms to the Next Level, Technology@Intel Magazine, Mar. 2005, pp. 1-7.

Jacob, et al, DRAM Memory System: Lecture 3, Spring 2003, University of Maryland 20 pgs.

Vogt, Fully Buffered DIMM (FB-DIMM) Server Memory Architecture: Capacity, Performance, Reliability, and Longevity, Feb. 18, 2004, Intel Developer Forum, pp. 1-33.

Neuberger, et al, A Multiple Bit Upset Tolerant SRAM Memory, ACM Transactions on Design Automation of Electronic Systems, vol. 8, No. 4, Oct. 2003, pp. 557-590, Universidade Federal do Rio Grande do Sul.

Intel E5700 Chipset MCH Intel x4 single Device data Correction (x4 SDDC) Implementation and Validation, Application Note (AP-726), Revision 1.0, Aug. 2002, Document Order No. 292274-001, 11 pgs.

U.S. Appl. No. 11/165,693, filed Jun. 24, 2005, Inventor: James W. Alexander et al, Title: Mitigating Silent Data Corruption in a Buffered Memory Module Architecture.

* cited by examiner

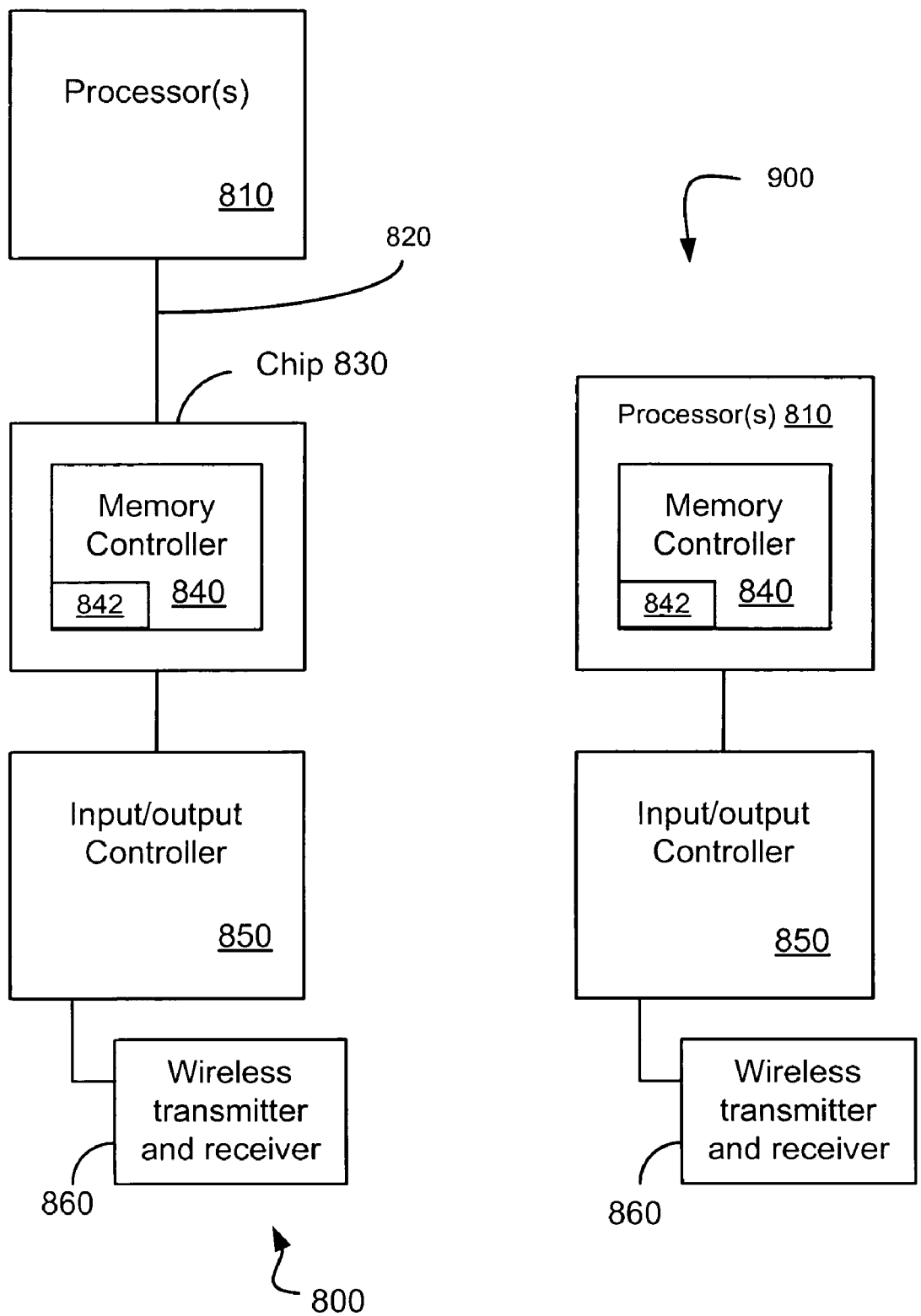

US 7,644,347 B2

SILENT DATA CORRUPTION MITIGATION USING ERROR CORRECTION CODE WITH EMBEDDED SIGNALING FAULT DETECTION

TECHNICAL FIELD

Embodiments of the invention generally relate to the field of information processing and, more particularly, to systems, methods and apparatuses for mitigating silent data corruption using error correction code with embedded signaling fault detection.

BACKGROUND

Memory content errors can be classified as either persistent (or permanent) errors and transient (or soft) errors. Persistent errors are typically caused by physical malfunctions such as the failure of a memory device or the failure of a socket contact. Transient errors, on the other hand, are usually caused by energetic particles (e.g., neutrons) passing through a semiconductor device, or by signaling errors that generate faulty bits at the receiver. These errors are called transient (or soft) errors because they do not reflect a permanent failure. A "faulty bit" refers to a bit that has been corrupted by a memory content or signaling error.

A soft error does not always affect the outcome of a program. For example, a memory system may not read a faulty bit. Also, many memory systems include error detection and/or error correction mechanisms that can detect and/or correct a faulty bit (or bits). These mechanisms typically involve adding redundant information to data to protect it against faults. One example of an error detection mechanism is a cyclic redundancy code (CRC). An example of an error correction mechanism is an error correction code (ECC).

Some soft errors, however, can affect the outcome of a program. A faulty bit that is detected by a CRC or an ECC may still affect the outcome of a program if the error cannot be corrected. A more insidious type of soft error, is one that is not detected by the memory system. A soft error may escape detection if the system does not have error detection hardware that covers a specific faulty bit, and then that data bit may be used by the system. Also, some faulty bits have errors that are weighted beyond the specification of the error protection mechanism used to detect them. The term "silent data corruption" (SDC) refers to an undetected error that affects program outcome.

Memory channels allocate some number of signaling bit-lanes to transfer data bits, and some number of bit-lanes to transfer error detection and correction bits. In general, a reduction in the number of bit-lanes in a memory channel leads to an increase in the exposure to silent data corruption. The reason for this is that the loss of a bit-lane causes a reduction in the amount of correction data that can be added to a packet of data sent through the memory channel. Typically, the amount of correction data added to a packet sent over a memory channel cannot be increased to compensate for a failed bit-lane because memory channels are designed to maintain short and precise round-trip times for packets.

Conventional memory systems (e.g., fully-buffered dual inline memory systems) use a 12-bit CRC (e.g., CRC-12) to detect a link signaling fault on a memory channel having 14 bit-lanes. These conventional memory systems also separately use an ECC to detect (and possibly correct) memory content errors. The ECCs in conventional memory systems are optimized to get a target level of functionality with the lowest latency over the smallest number of memory bits. Conventional ECCs, however, are not optimized to provide signaling fault detection.

Memory systems exhibit latency for reasons related to the input/output (I/O) rate of the memory channel and the access time of the memory devices. This latency is frequently important when designing a memory system. For example, conventional memory systems are typically designed to provide high reliability at the lowest possible latency. To meet these design goals, a minimum packet size is typically selected for packets transmitted over the memory channel. The minimum packet size typically includes K data bits protected by the minimum number of J correction bits needed to achieve a targeted level of reliability.

Recently, the I/O rate of dynamic random access memory (DRAM) has increased at a much faster rate than the access time for DRAM. Thus, the share of latency due to the I/O rate is decreasing in comparison to the share of latency due to access time. Many conventional memory systems do not, however, take full advantage of the increase in I/O rates.

BRIEF DESCRIPTION OF THE DRAWINGS

Embodiments of the invention are illustrated by way of example, and not by way of limitation, in the figures of the accompanying drawings in which like reference numerals refer to similar elements.

FIGS. 8A and 8B are block diagrams illustrating selected aspects of computing systems.

DETAILED DESCRIPTION

Embodiments of the invention are generally directed to an extended error correction code having embedded signaling fault detection. The extended error correction code (ECC) combines the detection of memory device faults with the detection of transient signaling faults on a memory read channel. In an embodiment, additional bits are added to the ECC to support signaling fault detection. For example, in one embodiment, the extended ECC includes an implementation of a 16-bit cyclic redundancy code (CRC). As is further discussed below, the relative penalty in system performance due the additional bits is low.

Figure 1:
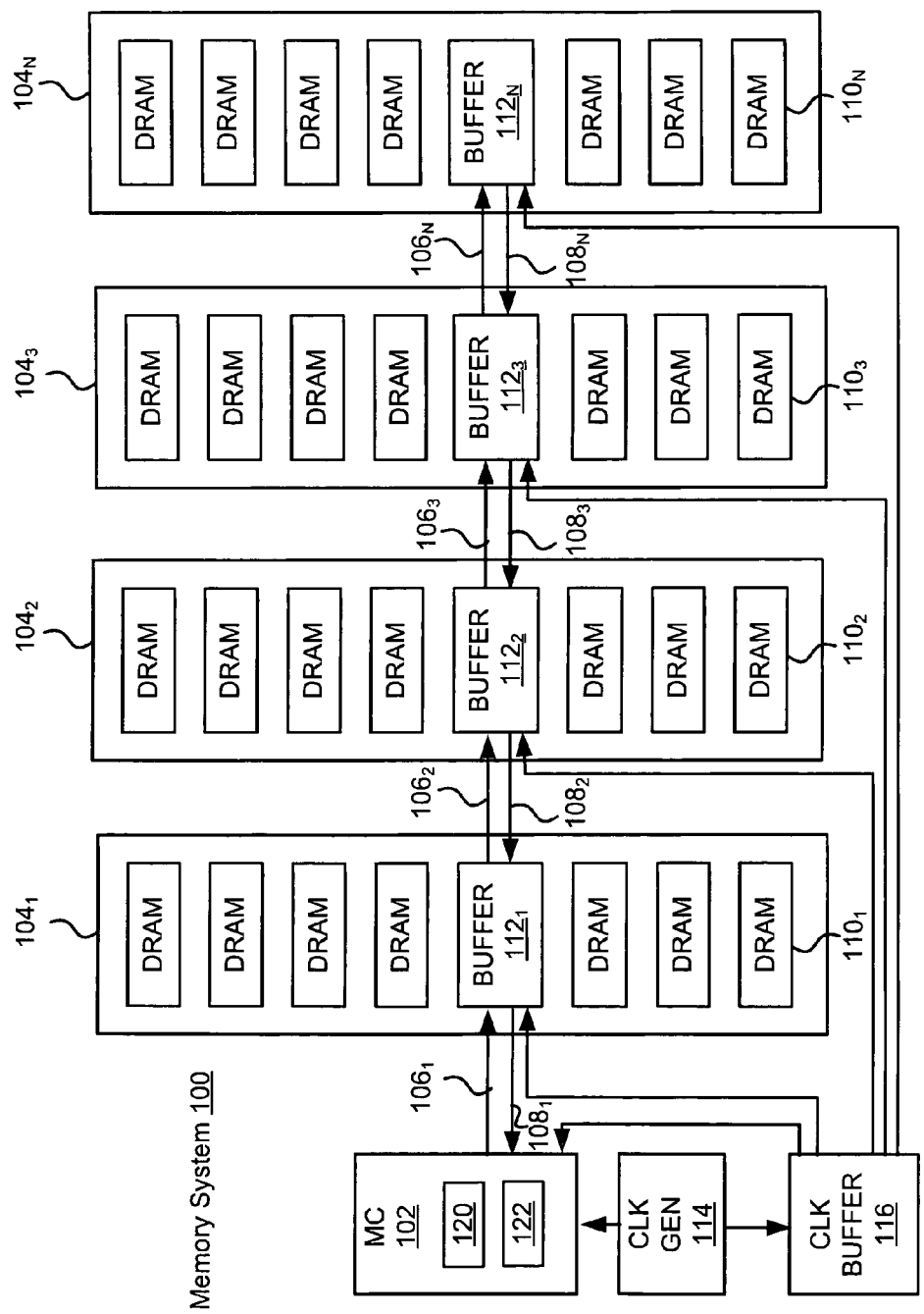
FIG. 1 is a high-level block diagram of a memory system implemented according to an embodiment of the invention.

FIG. 1 is a high-level block diagram of a memory system implemented according to an embodiment of the invention. In one embodiment, one or more memory modules $104_1$-$104_N$ are based on printed circuit boards having fingers along both sides of one edge to create a DIMM that may be plugged into a connector on another circuit board that holds other components of the system. Modules $104_1$-$104_N$ are populated with memory devices $110_1$-$110_N$. The number of modules and memory devices shown in FIG. 1 are only for illustrative purposes. That is, an embodiment may have a different number of modules, a different number of memory devices per module, and/or a different number of memory channels. In an embodiment, the memory devices are commodity-type dynamic random access memory (DRAM) such as Double Data Rate II (DDR2) DRAM. A memory buffer (e.g., memory buffers $112_1$-$112_N$) on each module isolates the memory devices from a channel that interfaces the modules to memory controller 102. In an embodiment, the channel is wired in a point-to-point arrangement with an outbound path that includes outbound links $106_1$-$106_N$, and an inbound path that includes inbound links $108_1$-$108_N$. In one embodiment, links 106 and 108 are implemented with parallel unidirectional bit-lanes using low-voltage differential signaling.

In the illustrated embodiment, no additional signal lines are used for functions such as command, reset, initialization, and the like. Instead, these functions are encoded directly in the data sent over the channel. In an alternative embodiment, any number of additional signal lines may be used to implement such functions.

Clock generator 114 generates a reference clock signal which is distributed to memory controller 102 and memory modules 104 through clock buffer 116. This facilitates a quasi-synchronous (mesochronous) clocking scheme in which locally generated clock signals are used to sample and redrive incoming data. In an embodiment, the data signals may be clocked without any frequency tracking because a common reference clock is available at each agent. In an alternative (plesiochronous) embodiment, a local clock signal may be generated independently of any common reference clock. In yet another alternative embodiment, a synchronous clocking scheme such as source synchronous strobing may be used.

In operation, memory controller 102 initiates data transfers by sending data to the innermost memory module 104 on the outbound path. The data may be organized into, for example, packets or frames (terms used interchangeable here). The innermost memory module $104_1$, receives and redrives the data to the next memory module (e.g., $104_2$) on the outbound path. Each memory module 104 receives and redrives the outbound data until it reaches the outermost memory module (e.g., $104_N$). In an embodiment, each memory module 104 may be capable of detecting (or being instructed) that it is the outermost memory module. In such an embodiment, the outmost memory module $104_N$ may disable any redrive circuitry to reduce unnecessary power consumption, noise, etc. In one embodiment, data transfers in the direction of the memory controller (e.g., the northbound or read direction) are initiated by the outermost memory module $104_N$. In such an embodiment, each memory module 104 receives and redrives inbound data along the inbound path until it reaches memory controller 102.

Any suitable communication protocol may be used over the physical channel. For example, memory controller 102 may initiate and schedule all inbound and outbound data transfers. Alternatively, any agent may be allowed to initiate data transfers. Frames of data may be configured to carry commands, read data, write data, status information, error information, initialization information, idle patterns, etc., or any combination thereof. A protocol may be implemented such that, when memory controller 102 sends a command frame to a target memory module 104 along the outbound path, the target memory module 104 responds by immediately sending a response frame back to memory module 104 along the inbound path. In such an embodiment, the target memory module 104 does not redrive the command frame on the outbound path.

In an alternative embodiment, the target module receives the command frame and then redrives the command frame on the outbound path. When the outermost memory module $104_N$ receives the command frame, it initiates a response frame (e.g., an idle frame) on the inbound path. The target memory module 104 then merges its response into the inbound data stream, for example, by replacing the response frame sent by the outermost module $104_N$ with the target memory module's 104 true response frame.

Memory controller 102 includes link signaling fault detection logic 120 and extended ECC 122. Link signaling fault detection logic 120 includes logic to detect a signaling fault on the memory channel. For example, link signaling fault detection logic 120 may be an implementation of one or more CRCs. In an alternative embodiment, different and/or additional signaling fault detection mechanisms may be used.

Extended ECC 122 combines the detection of memory device faults with the detection of transient signaling faults on a memory read channel. In an embodiment, extended ECC 122 includes an implementation of an ECC and an implementation of signaling fault detection logic. The signaling fault detection logic may be an implementation of a CRC. As is further described below, the embedded signaling fault detection logic enables ECC 122 to augment (or replace) signaling fault detection logic 120.

Figure 2:
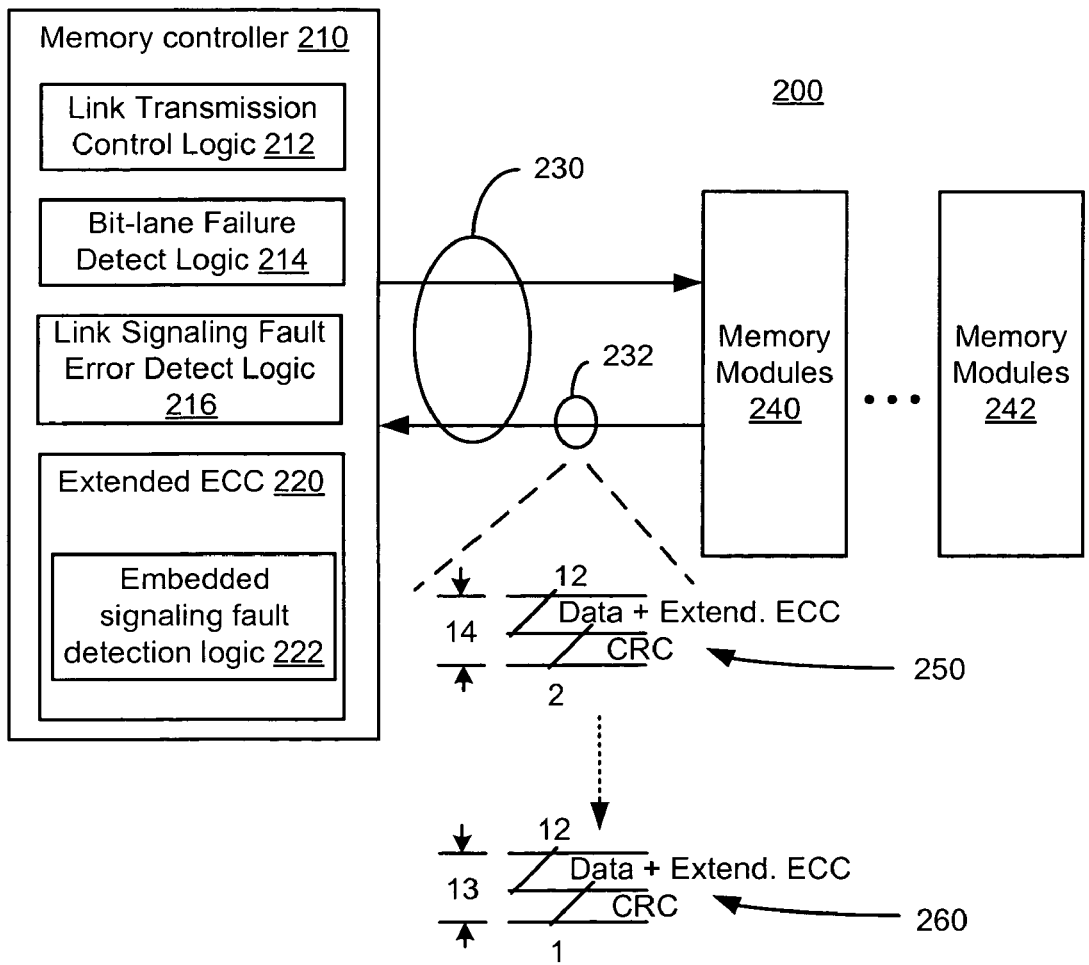
FIG. 2 is a block diagram of selected aspects of a memory system implemented according to an embodiment of the invention.

FIG. 2 is a block diagram of selected aspects of a memory system 200 implemented according to an embodiment of the invention. Memory system 200 includes memory controller 210, memory modules 240-242, and memory channel 230. In an embodiment, memory system 200 is based, at least in part, on the fully-buffered DIMM architecture. Memory controller 210 includes a number of agents including link transmission control logic 212, bit-lane failure detect logic 214, link signaling fault detect logic 216, and extended ECC 220. The term "agent" broadly refers to a functional element of memory controller 210. An agent may include hardware, software, firmware, and any combination thereof. In an alternative embodiment, memory controller 210 includes more agents, fewer agents, and/or different agents.

Link transmission control logic 212 controls, at least in part, the transmission of packets on memory channel 230. In an embodiment, link transmission control logic 212 includes a retry engine. A retry engine is an agent that enables memory controller 210 to selectively signal the need to resend faulty data. That is, a retry engine can selectively signal the need to resend faulty data from a memory module (e.g., memory module 104, shown in FIG. 1) to memory controller 210.

In an embodiment, memory system 200 supports a bit-lane failover mode. Bit-lane failover refers to selectively redirecting data to route the data around a failed bit-lane. The term "bit-lane failover mode" refers to a mode of operation for the memory system when at least one bit-lane has failed. Bit-lane failure detect logic 214 is an agent that detects whether a bit-lane (e.g., one of the northbound bit-lanes) has failed.

Bit-lane failure detect logic 214 (or, for ease of reference, detect logic 214) may test memory channel 230 under various conditions (and/or based on certain policies). In one embodiment, detect logic 214 tests for a failed bit-lane in connection with resending data. For example, detect logic 214 may test for a failed bit-lane if one or more of the following conditions are detected: CRC error; CRC valid and uncorrectable ECC error; CRC valid and suspected aliased correctable ECC error (which is treated as an uncorrectable ECC error); faulty (e.g., unexpected idle packet) write acknowledge; and/or CRC valid and correctable ECC error when running in CRC-N (e.g., CRC-6) mode. In an embodiment, the bit-lane error detector tests for a failed bit-lane by attempting to retrain the links of the memory channel. The error detector may identify a failed bit-lane by determining which bit-lanes cannot be retrained. In an alternative embodiment, the memory controller may use a different mechanism to identify a failed bit-lane.

Link signaling fault detection logic 216 is an agent that detects a signaling fault on northbound lanes 232. In an embodiment, link signaling fault detection logic 216 includes an implementation of one or more CRCs. For example, in an embodiment in which there are 14 northbound bit-lanes, link signaling fault detection logic 216 includes an M-bit CRC and an N-bit CRC. The M-bit CRC may be used when all northbound bit-lanes are operational and the N-bit CRC may be used when at least one northbound bit-lane has failed. In an alternative embodiment, in which there are 13 northbound bit-lanes, detection logic 216 may simply include the N-bit CRC. In one embodiment, M is equal to twelve and N is equal to six.

Extended ECC 220 is an agent that combines the detection of memory content errors with the detection of signaling fault errors. In one embodiment, extended ECC includes an implementation of a single error correct, double error detect Hamming style code to detect memory content errors. In an alternative embodiment, extended ECC 220 includes an implementation of a "b"-bit single device disable error correction code (SbEC-DED). In yet other alternative embodiments other and/or additional error correction codes may be used.

Extended ECC 220 includes embedded signaling fault detection logic 222. In an embodiment, signaling fault detection logic 222 is an implementation of a CRC (e.g., a 16-bit CRC). As is further described below, signaling fault detection logic 222 may augment the signaling fault detection capabilities of link signaling fault detection logic 216.

As shown by reference number 250, in an embodiment, there are 14 bit-lanes in the northbound direction of memory channel 230. Generally, twelve of these bit-lanes are used for data and two are used for CRC. If a bit-lane fails, however, then one of the two CRC bit-lanes may be used to convey data. In such an embodiment, link signaling fault detection logic 216 includes an M-bit CRC to detect signaling faults when all northbound bit-lanes are operational and an N-bit CRC to detect signaling faults when at least one bit-lane has failed.

Reference number 260 illustrates an alternative embodiment in which there are 13 bit-lanes in the northbound direction of memory channel 230. The 13 bit-lane implementation is a low cost implementation because it includes fewer signal traces. In the alternative embodiment, twelve of the northbound bit-lanes are, in general, used to convey data and one bit-lane is used to convey CRC data. Detection logic 216 includes an implementation of an M-bit CRC (e.g., a CRC-6). If a bit-lane fails in the alternative embodiment, then the CRC bit-lane is used to transport data.

The CRC-6, on its own, provides a modest level of signaling fault detection. The reason for the modest level of protection is that CRC-6 has a 1 in 64 chance of missing a catastrophic multi-bit signaling fault. For enterprise computing, a 1/64 chance of missing a multi-bit signaling fault is typically too high. Thus, in an embodiment (e.g., the 13 bit-lane embodiment), extended ECC 220 is always used to detect signaling faults. Extended ECC 220 either augments the CRC-6 when all bit-lanes are functioning or it provides all of the signaling fault detection when the system is in bit-lane failover mode.

In the 13 bit-lane embodiment, if all bit-lanes are functioning, then extended ECC 220 works in parallel with the CRC-6 to detect signaling fault errors. For example, when the memory controller receives data from memory channel 230 extended ECC 220 and the CRC-6 check for signaling fault errors in parallel. In an embodiment, if the CRC-6 detects a signaling fault error then the read operation is retried until two consecutive reads produce the same data. This allows the system to detect signaling faults without retrying memory faults because the CRC-6 only retries detected signaling fault errors.

If a bit-lane fails in the 13 bit-lane embodiment, then extended ECC 220 provides all of the signaling fault detection. For example, when the memory controller receives data from memory channel 230, extended ECC 220 checks the received data for a fault. In an embodiment, extended ECC 220 does not, on the basis of a single read operation, distinguish between a signaling fault error and a memory device error. In an embodiment, ECC 220 distinguishes between a signaling fault and a memory device fault by retrying a detected error until two consecutive reads return the same data. The operation of extended ECC 220 is further described below with respect to FIGS. 6 and 7.

In an embodiment, there is a potential for some loss in system performance. This potential for some loss in system performance is related to using the extended ECC to detect both memory device faults and transient signaling faults. In an embodiment, the extended ECC automatically retries detected faults. A fraction of these detected faults, however, are the result of permanent errors which cannot be corrected with a retry. Thus, the potential performance loss follows from the potential for retrying permanent errors.

Calculations based on typical workloads show that this potential loss in system performance is quite small. For example, assuming 16 DIMMs operating in bit-lane failover mode with a soft error rate (SER) of an error every 7,000 hours, an embodiment may exhibit 1 retry every 7,000 hours. Similar calculations may be performed for other typical workloads.

Figure 3:
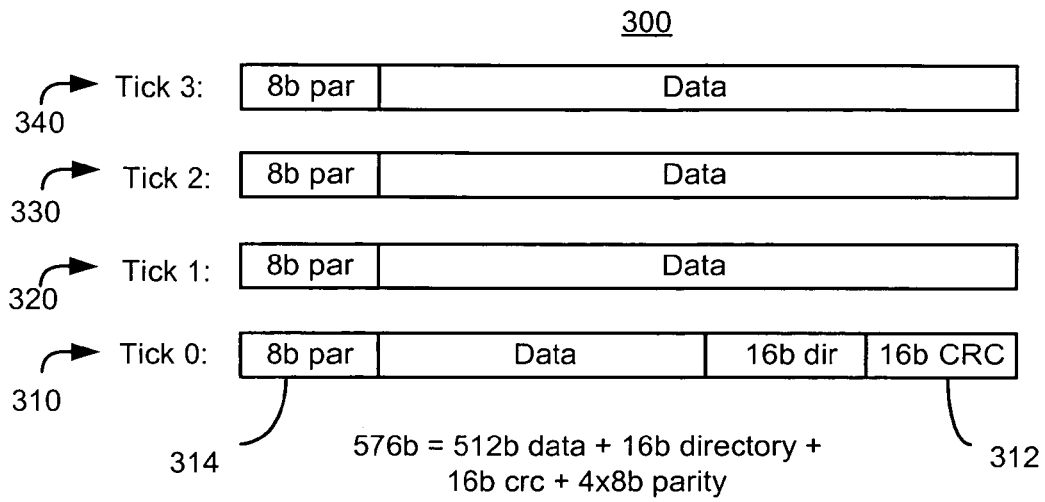
FIG. 3 is a block diagram illustrating selected aspects of a memory data word according to an embodiment of the invention.

FIG. 3 is a block diagram illustrating selected aspects of a memory data word according to an embodiment of the invention. In the illustrated embodiment, memory data word 300 includes 512 data bits and 47 redundant error correction bits. In an alternative embodiment, a memory data word may have a different number of data bits and/or a different number of error correction bits.

In an embodiment, the error code bits include a 16 bit CRC (312) for efficient error detection and several parity bits (e.g., 314). In alternative embodiments, a different CRC and/or other signaling fault detection logic may be used. An extended ECC (e.g., extended ECC 220, shown in FIG. 2) uses the 16 bit CRC to check for signaling fault errors. In addition, the error code bits include a number of parity bits (e.g., 314). In an embodiment, the extended ECC uses the CRC bits and the parity bits to implement various ECC functions. These ECC functions may include correcting correctable errors and/or flagging uncorrectable errors. In an alternative embodiment, the complete extended ECC (e.g., 16 bit CRC and parity bits) checks for signaling fault errors, or a subset of the check bits of the extended ECC is used for that purpose. An example of the parity bits is further discussed below with reference to FIG. 5.

Figure 4:
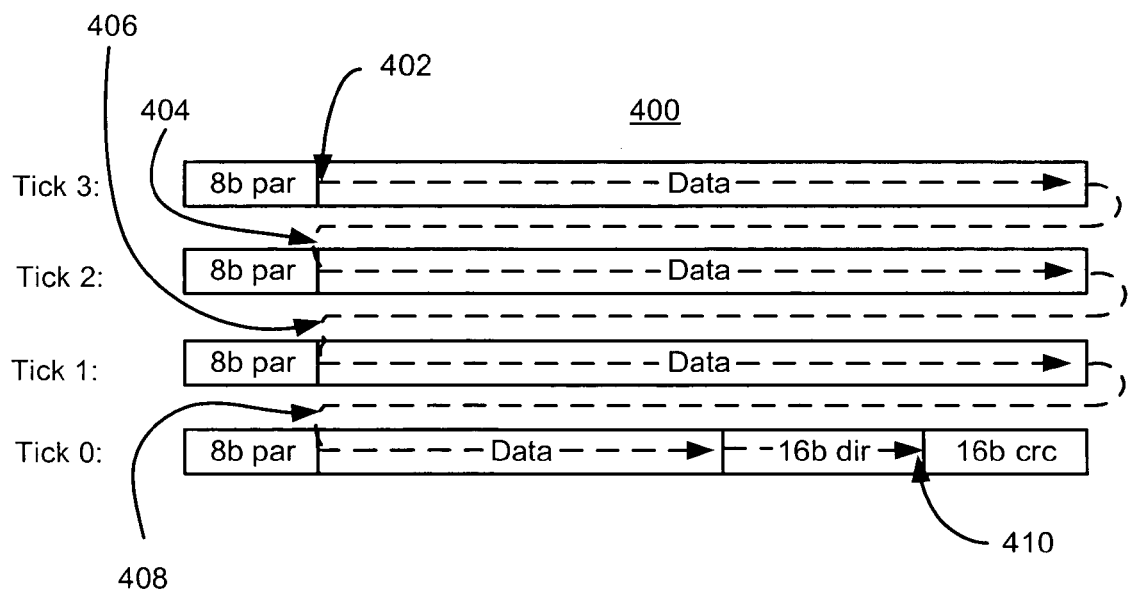
FIG. 4 is a block diagram that illustrates the generation of a cyclic redundancy code (CRC), according to an embodiment of the invention.

FIG. 4 is a block diagram illustrating the generation of a cyclic redundancy code (CRC), according to an embodiment of the invention. Memory data word 400 is an example of a memory data word read from memory. In an embodiment, the CRC is generated in a serpentine manner starting from the top left and proceeding to the lower right of memory data word 400. For example, the CRC check starts with the data bit (402) in the upper left corner and serially proceeds from left to right. At the right end of tick 3, the CRC check proceeds to the far left bit of tick 2 in a serpentine manner as shown by 404. The CRC check proceeds serially across tick 2 from left to right. The CRC check continues in a serpentine manner down and across ticks 1 and 0 as shown by 406 and 408 until it reaches the last data bit at 410. In an alternative embodiment, the order of the CRC generation may be defined differently.

Figure 5:
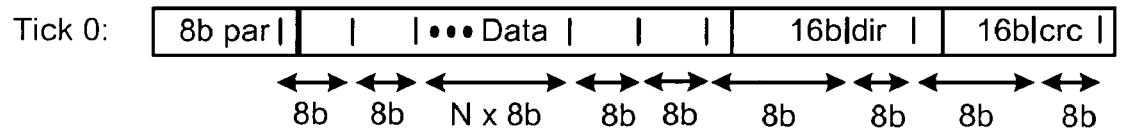
FIG. 5 is a block diagram illustrating the generation of parity bits according to an embodiment of the invention.

FIG. 5 is a block diagram illustrating the generation of parity bits according to an embodiment of the invention. In the illustrated embodiment, each tick of memory data word 500 includes sixteen 8b data blocks. In one embodiment, a 4×8b parity generation scheme is used. For example, parity bits may be generated for each of the eight bits in the sixteen data blocks on a bit-by-bit module eight basis. In an alternative embodiment, a different parity bit generation scheme may be used.

Figure 6:
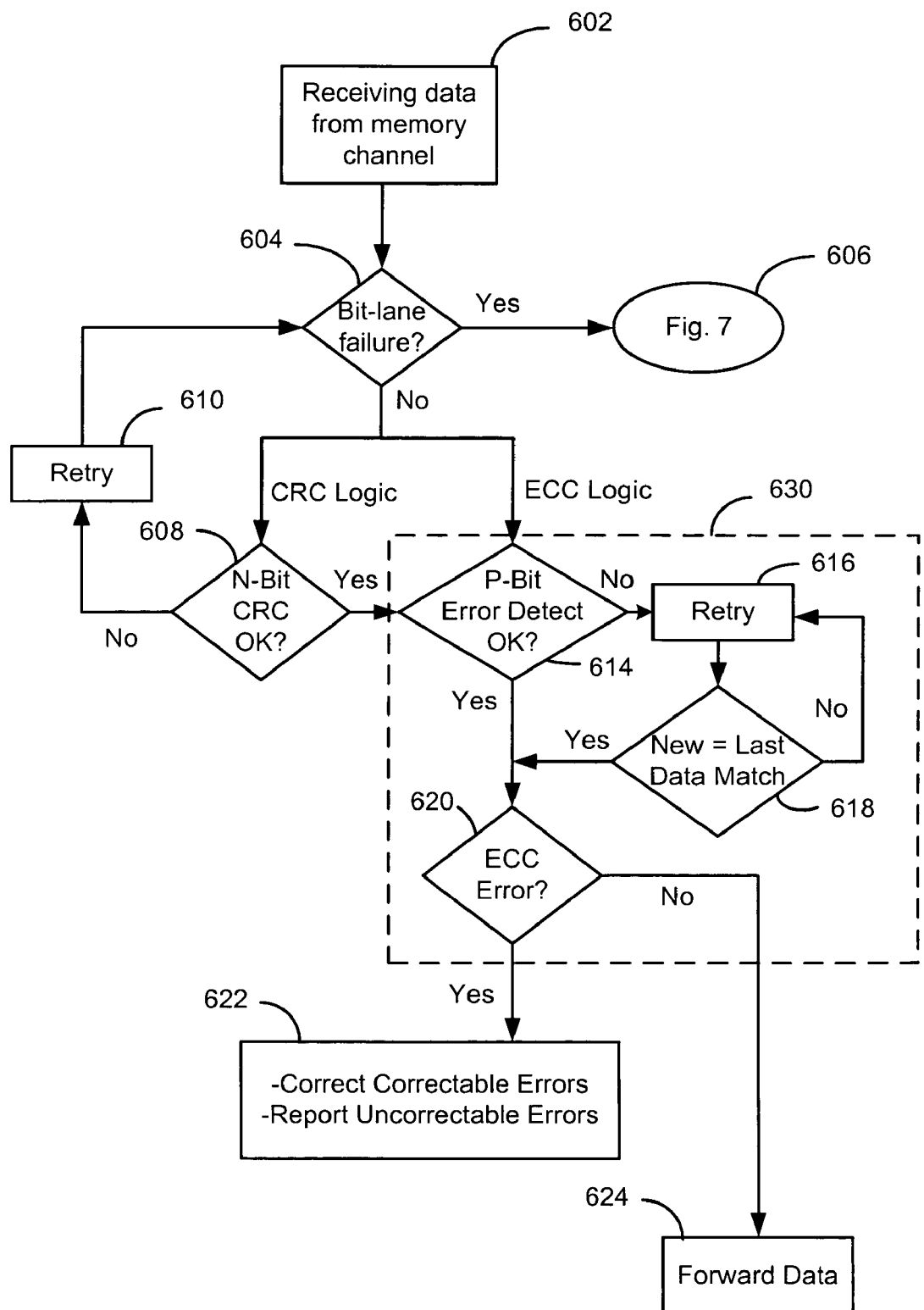
FIG. 6 is a flow diagram illustrating selected aspects of the operation of a memory controller according to an embodiment of the invention.
Figure 7:
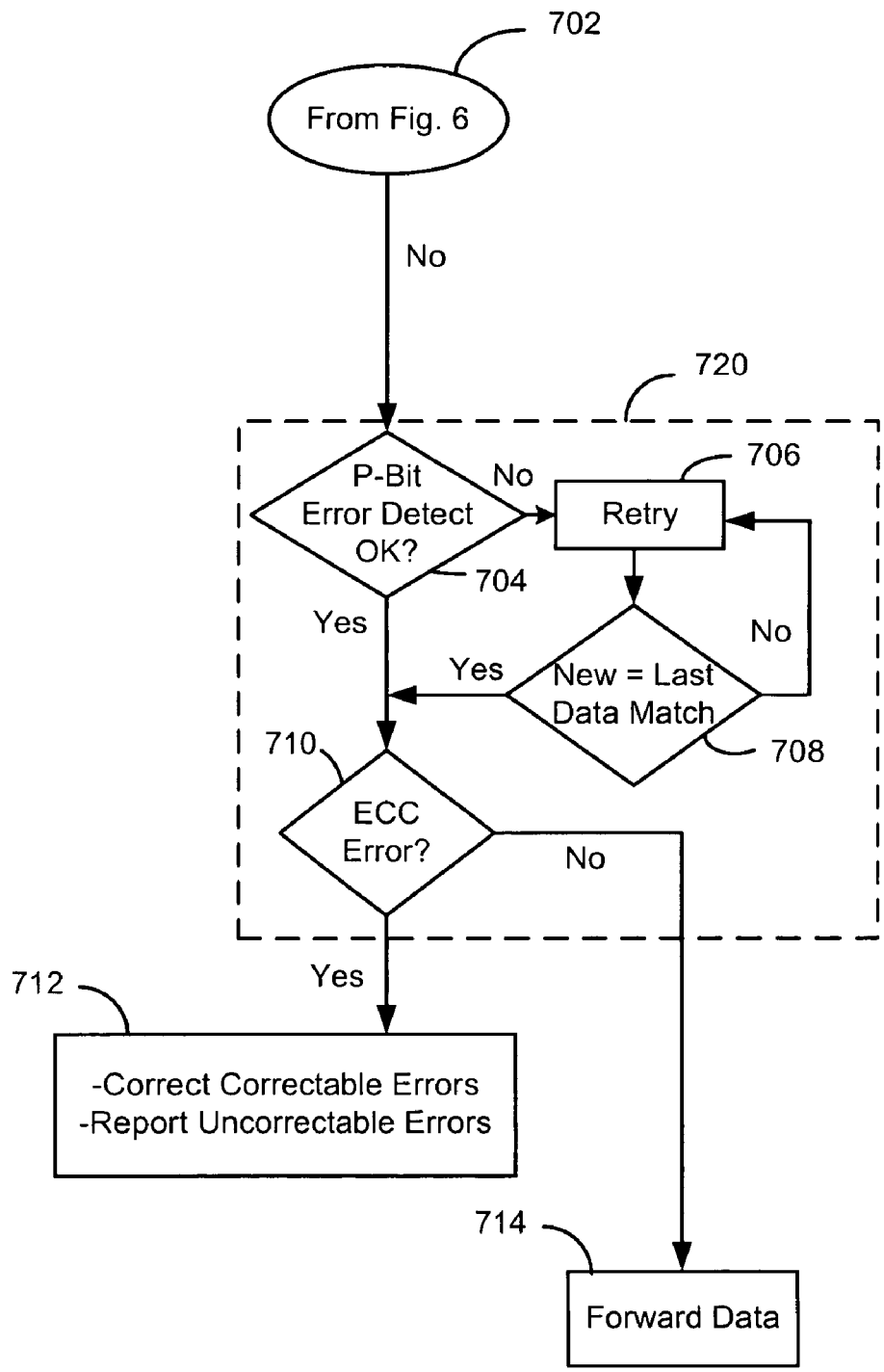
FIG. 7 is a flow diagram illustrating selected aspects of the operation of a memory controller when at least one bit-lane has failed, according to an embodiment of the invention.

The operation of an embodiment of the invention is described below with reference to FIGS. 6 and 7. For ease of description, FIGS. 6 and 7 are directed to an embodiment in which an extended ECC is coupled with a 13 bit-lane memory channel (e.g., a low cost solution). In some 13 bit-lane embodiments, the extended ECC provides signaling fault detection that is equal to or better than the signaling fault detection that is provided by a 12-bit CRC on 14 bit-lanes. In an embodiment, the extended ECC provides strong signaling fault protection even when one of the 13 bit-lanes fails. The strong signaling fault detection mitigates silent data corruption, in embodiments of the invention. In alternative embodiments, the memory channel may have a different number of bit-lanes and the operation of the extended ECC may vary from what is shown in FIGS. 6 and 7.

FIG. 6 is a flow diagram illustrating the operation of a memory controller according to an embodiment of the invention. Referring to process block 602, a memory controller receives data from a memory channel. In an embodiment, the received data is of a longer than minimum memory data word size that provides extra correction bits to strongly detect signaling faults on, for example, a 13 bit memory read channel. The memory controller determines whether all 13 bit-lanes are operational at 604. In an embodiment, the determination of whether all 13 bit-lanes are operation is based, at least in part, on bit-lane failure detect logic (e.g., bit-lane failure detect logic 214, shown in FIG. 2). If at least one bit-lane has failed, then the process proceeds to FIG. 7 as shown by 606.

If all 13 bit-lanes are operational, then an N-bit CRC (or other link signaling fault detection logic) and an extended ECC process the received data in parallel. The N-bit CRC checks the data for signaling fault errors at 608. If the N-bit CRC detects an error, then the read operation is retried at 610.

Referring to 630, an extended ECC processes the received data in parallel with the processing performed by the N-bit CRC. As discussed above, the extended ECC includes embedded signaling fault detection logic. With reference to FIG. 6, the embedded signaling fault detection logic is implemented with a P-bit error detect logic. In one embodiment, the P-bit error detect logic is based, at least in part, on a P-bit CRC (e.g., a 16-bit CRC). In an alternative embodiment, different error detection logic may be used. The P-bit error detect logic checks for signaling fault errors at 614. In an alternative embodiment, the P-bit error detect logic checks the complete extended ECC (e.g., 16 bit CRC and parity bits), or a subset of check bits of the complete extended ECC. If the P-bit error detect logic detects an error then the read operation is retried at 616. In one embodiment, the read operation is retried in a loop until two consecutive reads produce the same data as shown by 618.

If no signaling fault is detected (e.g., when two consecutive reads return the same data), then the extended ECC checks for an ECC error at 620. In one embodiment, the extended ECC checks for an ECC error based, at least in part, on a combination of parity bits and CRC bits contained in the received memory data word. If the extended ECC detects an ECC error, then it attempts to correct correctable errors or report uncorrectable errors as appropriate (622). If the extended ECC does not detect an ECC error then it forwards the data to the entity that requested the data (e.g., a processor) at 624.

FIG. 7 is a flow diagram illustrating selected aspects of the operation of a memory controller when at least one bit-lane has failed, according to an embodiment of the invention. In an embodiment, the N-bit CRC is not used in the bit-lane failover mode because the CRC bit-lane is used to transport data rather than CRC bits. Thus, the extended ECC provides both signaling fault detection and memory device failure detection. Referring to reference number 702, the extended ECC receives the data from the memory channel.

A P-bit error detect logic checks for signaling fault errors at 704. In an embodiment, the P-bit error detect logic is based, at least in part, on a P-bit CRC (e.g., a 16-bit CRC). In an alternative embodiment, different error detection logic may be used. If the P-bit error detect logic detects a signaling fault, then the read operation is retried at 706. In an embodiment, the read operation is retried in a loop until two consecutive read operations return the same data as shown by 708.

If no signaling fault is detected (e.g., when two consecutive reads return the same data), then the extended ECC checks for an ECC error at 710. In one embodiment, the extended ECC checks for an ECC error based, at least in part, on a combination of parity bits and CRC bits contained in the received memory data word. If the extended ECC detects an ECC, then it attempts to correct correctable errors or report uncorrectable errors as appropriate (712). If the extended ECC does not detect an ECC error then it forwards the data to the entity that requested the data (e.g., a processor) at 714.

FIGS. 8A and 8B are block diagrams illustrating, respectively, selected aspects of computing systems 800 and 900. Computing system 800 includes processor 810 coupled with an interconnect 820. In some embodiments, the term processor and central processing unit (CPU) may be used interchangeably. In one embodiment, processor 810 is a processor in the XEON® family of processors available from Intel Corporation of Santa Clara, Calif. In an alternative embodiment, other processors may be used. In yet another alternative embodiment, processor 810 may include multiple processor cores.

According to one embodiment, interconnect 820 communicates with chip 830. In one embodiment, chip 830 is a component of a chipset. Interconnect 820 may be a point-to-point interconnect or it may be connected to two or more chips (e.g., of the chipset). Chip 830 includes memory controller 840 which may be coupled with main system memory (e.g., as shown in FIG. 1). In an alternative embodiment, memory controller 840 may be on the same chip as processor 810 as shown in FIG. 8B. In an embodiment, extended ECC 842 combines the detection of memory device faults with the detection of transient signaling faults on a memory read channel. For ease of description, extended ECC 842 is shown as a block within memory controller 840. In an alternative embodiment, extended ECC 842 may be implemented in a different part of the chipset and/or may be distributed across multiple components of the chipset.

Input/output (I/O) controller 850 controls the flow of data between processor 810 and one or more I/O interfaces (e.g., wired and wireless network interfaces) and/or I/O devices. For example, in the illustrated embodiment, I/O controller 850 controls the flow of data between processor 810 and wireless transmitter and receiver 860. In an alternative embodiment, memory controller 840 and I/O controller 850 may be integrated into a single controller.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

What is claimed is:

1. An Apparatus comprising:
a first agent for coupling with a memory through a memory channel, the first agent to control link transmission on the memory channel;
a second agent coupled with the first agent, the second agent to implement an error correction code function and having embedded signaling fault detection logic; and
a third agent coupled with the first agent, the third agent including signaling fault detection logic, both the signaling fault detection logic and the embedded signaling fault detection logic to detect a signaling fault if a bit line failure condition does not exist, and, the embedded signaling fault detection logic but not the signaling fault detection logic to detect a signaling fault if a bit line failure condition does exist.

2. The apparatus of claim 1, wherein the embedded signaling fault detection logic includes an embedded implementation of a P-bit check code.

3. The apparatus of claim 2, wherein the P-bit check code includes a P-bit cyclic redundancy code.

4. The apparatus of claim 1, wherein the signaling fault detection logic of the third agent includes an implementation of an N-bit cyclic redundancy code.

5. The apparatus of claim 4, wherein P is greater than N.

6. The apparatus of claim 5, further comprising:
a bit-lane failure detection agent to detect a failure of a bit-lane in the memory channel.

7. The apparatus of claim 6, wherein the correction code is, at least in part, an implementation of a single b-bit error correcting-double bit error correcting (SbEC-DED) error correction code (ECC).

8. The apparatus of claim 1, wherein the memory channel is a fully buffered dual inline memory module (DIMM) channel.

9. The apparatus of claim, 8, wherein the fully buffered DIMM channel is a thirteen bit fully buffered DIMM channel.

10. The method comprising:
detecting that a bit line failure has not occurred;
applying first signaling fault detect logic and second signaling fault detection logic in response to said detecting;
detecting a signaling fault on a memory channel with the first signaling fault detection logic;
retrying a read operation for two consecutive reads in response to the detecting of the signaling fault;
determining if the retrying of the read operation resulted in identical data packets returned from the memory;
determining whether a data packet contains a memory content error; and,
detecting that a bit line failure has occurred and disabling the first signaling fault detection logic in response thereto, wherein, the second signaling fault detection logic remains operative.

11. The method of claim 10, wherein the memory content error is one of a correctable error or an uncorrectable error and further comprising:
correcting the correctable error, if the data packet contains the correctable error; and
reporting the uncorrectable error, if the data packet contains an uncorrectable error.

12. The method of claim 10, wherein the first signaling fault detection logic includes an implementation of an N-bit cyclic redundancy code.

13. The method of claim 10, wherein after the applying and before the detecting the following is performed:
receiving a data packet from the memory channel;
performing an N-bit cyclic redundancy code (CRC) check on the packet with the first signaling fault detection logic; and
performing a P-bit CRC check on the packet with the second signaling fault detection logic.

14. The method of claim 13, wherein the N-bit CRC and the P-bit CRC are substantially performed in parallel.

15. A system comprising:
a memory channel;
a Memory module coupled with the memory channel, the memory module including one or more memory devices;
a memory controller coupled with the memory channel, the memory controller including a first agent to implement an error correction code function and having embedded signaling fault detection logic; and the memory controller having a second agent having signaling fault detection logic, both the signaling fault detection logic and the embedded signaling fault detection logic to detect a signaling fault if a bit line failure condition does not exist, the embedded signaling fault detection logic but not the signaling fault detection logic to detect a signaling fault if a bit line failure condition does exist.

16. The system of claim 15, wherein the signaling fault detection logic of the second agent includes an implementation of an N-bit cyclic redundancy code (CRC); and the embedded signaling fault detection logic includes an implementation of a P-bit error detection logic.

17. The system of claim 16, wherein the error correction code includes an implementation of a single b-bit error correcting double bit detecting (SbEC-DEC) error correction code (ECC).

18. The system of claim 15, wherein the memory channel is a fully buffered dual inline memory module (DIMM) memory channel.

19. The system of claim 18, wherein the fully buffered DIMM memory channel is a thirteen bit-lane fully buffered DIMM memory channel.

* * * * *